United States Patent [19]

Timsit

[11] 4,057,795
[45] Nov. 8, 1977

[54] ANALOG-TO-DIGITAL ENCODER

[75] Inventor: Claude Timsit, Grigny, France

[73] Assignee: Association pour le Developpement de l'Enseignement et de la Recherche en Systematique Appliquee (A.D.E.R.S.A.), Velizy-Villacoublay, France

[21] Appl. No.: 624,124

[22] Filed: Oct. 20, 1975

[30] Foreign Application Priority Data

Apr. 22, 1974 France .............................. 74.13923

[51] Int. Cl.$^2$ ........................................ H03K 13/175
[52] U.S. Cl. ............................................. 340/347 AD
[58] Field of Search ................ 340/347 AD; 307/235

[56] References Cited

U.S. PATENT DOCUMENTS

| | | | |
|---|---|---|---|
| 3,089,134 | 5/1963 | Robinson | 340/347 AD |
| 3,241,135 | 3/1966 | Kuflik | 340/347 AD |
| 3,425,054 | 1/1969 | Cowan | 340/347 AD |
| 3,573,798 | 4/1971 | Reiling | 340/347 AD |
| 3,585,631 | 6/1971 | McCown | 340/347 AD |
| 3,644,924 | 2/1972 | Kitaguchi | 340/347 AD |
| 3,721,975 | 3/1973 | Brinkman | 340/347 AD |
| 3,806,915 | 4/1974 | Higgins | 340/347 AD |
| 3,935,569 | 1/1976 | Marcel | 340/347 AD |

OTHER PUBLICATIONS

Aldrich, "IBM Technical Disclosure Bulletin" vol. 9, No. 8 Jan. 1967 pp. 1054–1056.

Primary Examiner—Charles D. Miller

[57] ABSTRACT

This encoder comprises a series of resistors for determining the reference voltages, and comparators having at least one pair of outputs A and B. First inputs of said comparators are connected respectively to said resistors and second inputs of said comparators are connected to the voltage to be encoded through an impedance adaptor stage. The outputs A and B of the pairs of outputs of each comparator are respectively connected to the outputs B and A of the following comparator and constitute first and second output groups. The first and second groups are connected respectively to the inputs of a comparator constituting a bit of smallest weight of the encoder and the outputs A and B of the other pairs of outputs are connected in a similar manner to comparators constituting bits of greatest weight.

11 Claims, 6 Drawing Figures

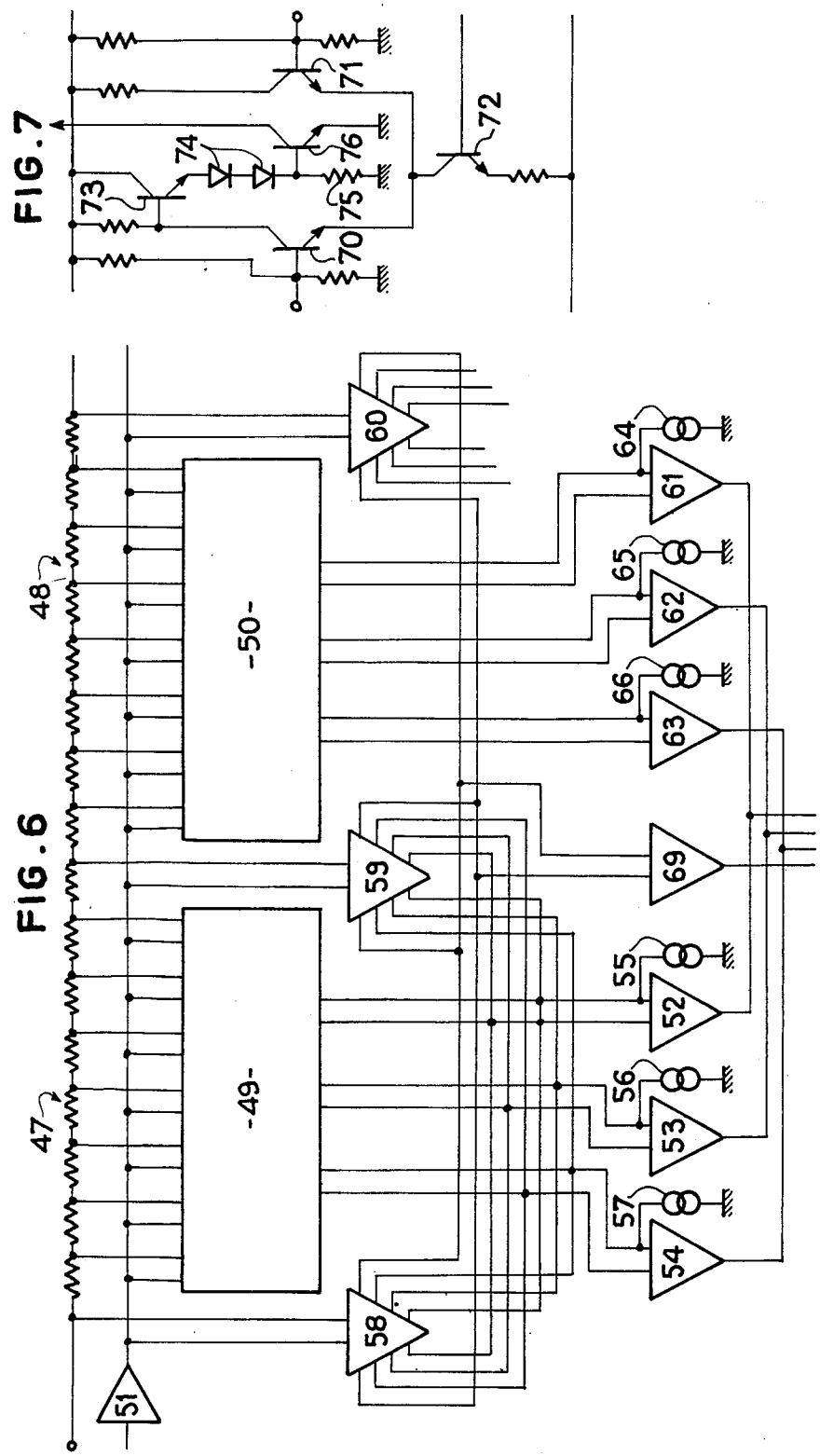

ANALOG-TO-DIGITAL ENCODER

The present invention relates to analog-to-digital encoders and more particularly to an encoder of this type which is extremely rapid and can be easily produced in the form of an integrated circuit.

Analog-to-digital encoders are known comprising comparator circuits connected in parallel between a series of reference voltages determined by a scale of resistances in series and a voltage to be converted. The outputs of these comparators are connected to a logic circuit whose function is to deduce, from the output signals of the comparators the digital value of the analog voltage to be converted, this logic circuit being connected in turn to an output circuit.

Although they operate in a satisfactory manner, the encoders of the aforementioned type have the drawback of delivering digital signals with a certain delay with respect to the encoded analog voltage. This delay, essentially due to the presence of the logic circuit, is unacceptable in certain rapid electronic applications.

An object of the invention is to overcome the aforementioned drawback and to provide an analog-to-digital encoder which does not require the use of an intermediary logic circuit at the output of the comparators and is consequently much more rapid than known encoders.

Another object of the invention is to provide an analog-to-digital encoder which is easily produced in the form of an integrated circuit.

According to the invention, there is provided a method for encoding an analog voltage in the digital form, comprising comparing the voltage to be encoded with a series of reference voltages, comprising effecting a first sum of the result of each comparison with the inverse of the result of the following comparison and a second sum of the inverse of the result of each comparison with the result of the following comparison, comparing said two sums so as to obtain the bit of smallest weight, effecting the aforementioned first and second sums for the results of the comparisons of orders $2^1 p$ with $1 \leq p \leq 2^{b-2} - 1 \ldots$, $2^2 q$ with $1 \leq q \leq 2^{b-2} - 1$ $\ldots 2^k z$ with $1 \leq z \leq 2^{b-k} - 1$, wherein $b$ is the resolution of the desired encoding, and comparing each first sum with the corresponding second sum so as to obtain the second, third . . . . , $k$th bits up to the bit of greatest weight.

Another object of the invention is to provide an analog-to-digital encoder adapted to carry out the method defined hereinbefore, said encoder comprising a series of comparators, one input of which comparators being connected to a voltage to be encoded and the other input of which comparators being connected to a corresponding reference voltage, wherein the comparators comprise at least one pair of outputs, a first output of each pair delivering a signal resulting from the corresponding comparison and a second output delivering the inverse of said signal, the comparators of order $2^1 p$ with $1 \leq p \leq 2^{b-1} - 1$, $2^2 q$ with $1 \leq q \leq 2^{b-2} - 1 \ldots$, $2^k z$ with $1 \leq z \leq 2^{b-k} - 1$, wherein $b$ is the resolution of the encoder, having respectively, two, three . . . $k$ pairs of outputs, said first and second outputs of each comparator being connected to said second and first outputs of the following comparator so as to constitute a first and second group of outputs, the first group of outputs being connected to a first input of a comparator of currents constituting the bit of the smallest weight, whereas the second group of outputs is connected to the second input of said current comparator, the comparators of order $2^1 p$, $2^2 q \ldots 2^k z$ being connected in a similar manner to the corresponding inputs of current comparators constituting second, third . . . . $k$th bits up to the bit of the greatest weight of the voltage to be encoded.

According to a particular feature of the invention, said encoder further comprises, on each side of said series of comparators connected by one of their inputs to the voltage to be encoded and by their other inputs to reference voltages, an inhibiting comparator for the encoder when the voltage to be encoded is outside the range of voltage defined by the reference voltages to which the comparators of said series are connected, said inhibiting comparators comprising a number of pairs of inhibiting outputs equal to the resolution of the encoder, each pair of outputs comprising a first output adapted to deliver the result of a comparison and a second output adapted to deliver the inverse of said result, the first and second outputs of an inhibiting comparator being connected respectively to the second and first outputs of the other comparator and thus constituting a first and a second group of inhibiting outputs, said first and second groups of inhibiting outputs being connected respectively to the first and second inputs of one of said current comparators constituting bits of the encoder, a source of current for compensating for the lack of equilibrium produced by the connection of said groups of inhibiting outputs being connected to one of the inputs of each current comparator.

Further features of the invention will be apparent from the ensuing description with reference to the accompanying drawings which are given solely by way of example and in which:

FIg. 6 is the circuit diagram of an assembly of two encoders according to the invention arranged as a four bits encoder, and FIG. 7 is a diagram of an output current comparator forming part of the construction of the circuits shown in FIGS. 1, 5 and 6.

Figure 1:
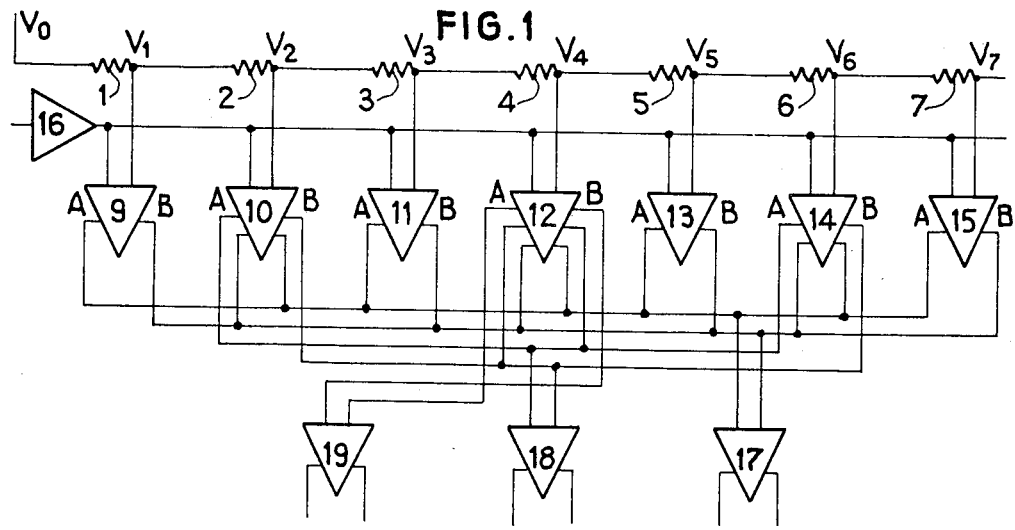
FIG. 1 is a circuit diagram of the encoder according to the invention.

Before describing the analog-to-bit encoder according to the invention, there will be indicated a number of general principles on which the design of the encoder is based, and certain conventions necessary to the following explanations.

It will be assumed firstly that the analog-to-digital encoder to be designed is an encoder intended to convert an analog voltage into a pure binary signal.

It is known that in order to construct an encoder of this type, there must be employed an odd number N of comparator stages connected in parallel and serving to compare the input signal with a number N of reference voltages.

The reference voltages with which the signal to be encoded must be compared are designated $V_1$ to $V_N$.

Let it be assumed that the analog voltage to be encoded must be expressed in a pure binary code.

It will be agreed that the intervals between an even index voltage, namely $V_{2i}$, and a neighbouring odd index voltage, namely $V_{2i+1}$, will be termed even intervals and that the intervals between an odd index voltage, namely $V_{2i-1}$, and an even index voltage, namely $V_{2i}$, will be termed odd intervals.

$i$ satifies the following relation:

$$0 \leq i \leq \frac{N-1}{2}.$$

There is given hereunder the table of the pure binary codes which, in order to simplify the description, is a table of codes having three bits.

0 0 1
0 1 0
0 1 1
1 0 0
1 0 1
1 1 0
1 1 1

It will be observed from this table that the bit of the smallest weight of a code expressing an even value is a ZERO, whereas the bit of the smallest weight expressing an odd value is a ONE.

As the number N of reference voltages, and consequently the number of comparators is odd, N can always be written $N = 2^b - 1$, wherein $b$ is the resolution of the encoder.

N can also be written: $N = 2^{b-1} + 2^{b-1} - 1$.

N is always formed from the sum of an even number and an odd number.

When $b = 3$, $N = 2^2 + 2^2 - 1 = 4 + 3$.

Let it be assumed that it is possible to have, at the output of each comparator, a signal relating to the comparison effected thereby and its complement which will be designated A and B, it being understood that $A = \overline{B}$.

By adding all the signals A of the odd comparators to the signals B of the even comparators, and all the signals B of the odd comparators to the signals A of the even comparators, signals C and D are obtained given by the following relations, taking into account the changes of state of the comparators which are on each side of the value of the voltage to be encoded:

$$C = (A_1 + A_3 + \ldots A_{2i-1}) + (A_{2i+1} + \ldots + A_{2^b-1})$$
$$+ (B_2 + B_4 + \ldots B_{2i}) + (B_{2i+2} + \ldots B_{2^b-2})$$

$$D = (B_1 + B_3 + \ldots B_{2i-1}) + (B_{2i+1} + \ldots + B_{2^b} _{-1}) + (A_2 + A_4 + A_{2i}) + (A_{2i+2} + A_{2i+2} + \ldots A_{2^b} - 2).$$

Assuming that the outputs A and B are respectively equal to 1 and 0 when the value of the voltage to be encoded is higher than the values of the reference voltages applied to the corresponding comparators and that inversely, the outputs A and B are respectively equal to 0 and 1 in the opposite case, two cases are to be considered.

If the voltage to be encoded is in an even interval the $2i$ first comparators have outputs A equal to 1 and outputs B equal to 0.

The values of C and D are expressed as follows:

$$C = i \times 1 + (2^{b-1} - i) \times 0 + i \times 0 + 2^{b-1} - 1 - i) \times 1 = (2^{b-1} - 1) \times 1 + (2^{b-1})0 = 2^{b-1} - 1$$

$$D = i \times 0 + (2^{b-1} - i) \times 1 + i \times 1 + (2^{b-1} - 1 - i) \times 0 = (2^{b-1} - 1) \times 0 + (2^{b-1}) \times 1 = 2^{b-1}.$$

It will be observed, on one hand, that the sum $C + D = 2^{b-1} - 1 + 2^{b-1}$ is no other than the number N and, on the other hand, that for a voltage to be encoded which is in an even interval, $C < D$.

If the voltage to be encoded is in an odd interval, the $2i+1$ first comparators have outputs A equal to 1 and outputs B equal to 0.

The values C and D are then expressed in the following manner:

$$C = (i + 1) \times 1 + (2^{b-1} - i - 1) \times 0 + \times i \times 0 + (2^{b-1} - 1 - i) \times = (2^{b-1}) \times 1 + (2^{b-1} - 1) \times 0 = 2^{b-1}$$

$$D = (i+1) \times 0 + (2^{b-1} - i - 1) \times 1 + i \times 0 + (2^{b-1} - 1 - i) \times 0 = (2^{b-1}) \times 0 + (2^{b-1} - 1) \times 1 = 2^{b-1} - 1.$$

Therefore, for a voltage to be encoded which is in an odd interval, $C > D$.

As, moreover, the bit of smallest weight of an even value is equal to 0 and the bit of smallest weight of an odd value is equal to 1, it is sufficient to compare the values C and D defined hereinbefore to obtain the bit of the smallest weight of the voltage to be encoded.

With reference again to the table of pure binary codes, it can be seen that in order to obtain the bits of the greatest weight of the voltage to be encoded, it is sufficient to possess a signal resulting from the comparison and its complement from the comparators of order $2^1 p$ with $1 \leq p \leq 2^{b-1} - 1$ for the second bit, $2^2 q$ with $1 \leq q \leq 2^{b-2} - 1$ for the third bit, $2^k z$ with $1 \leq z \leq 2^{b-k} - 1$ for the $k$th bit.

Bearing in mind the foregoing explanations there will now be described an embodiment of the analog-to-digital encoder according to the invention.

In FIG. 1, the invention is considered as being applied to an analog-to-digital encoder having three bits.

This encoder comprises a scale of seven resistors 1 to 7 connected in series and supplied by two constant voltages $V_0$ and $V_7$ so that $V_7 >$ than $V_0$. These seven resistors respectively define seven reference voltages $V_1$ to $V_7$.

The junction points of two consecutive resistors are each connected to an input of a current comparator 9 to 15. The other inputs of these comparators are all connected to the voltage to be encoded through an impedance adaptor stage 16 which is common thereto.

The comparators 9 to 15 are comparators having voltage inputs and current outputs which will be described hereinafter.

The comparators 9 to 15, all of which, as seen hereinbefore, intervene in the determination of the bit of the smallest weight of the voltage to be encoded, each comprise a pair of outputs A and B.

The comparators 10, 12 and 14, which intervene in the determination of the bit of medium weight, comprise a second pair of outputs A and B.

Lastly, the comparator 12, which determines the bit of the greatest weight, comprises a third pair of outputs A and B.

The outputs A of the odd comparators 9, 11, 13 and 15 and the outputs B of the even comparators 10, 12 and 14, are connected to a first input of a current comparator 17 and the outputs B of the odd comparators 9, 11, 13 and 15 and the outputs A of the comparators 10, 12 and 14 are connected to a second input of the comparator 17.

The outputs A of the second pairs of outputs of the comparators 10 and 14 and the outputs B of the corresponding pair of outputs of the comparator 12 are connected to a first input of a current comparator 18, and the outputs B of the corresponding pairs of outputs of the comparators 10 and 14 and the output A of the comparator 12 are connected to a second input of the comparator 18.

Lastly, the output A and the output B of the third pair of outputs of the comparator 12 are each connected to an input of a third current comparator 19.

In the presently-described embodiment, the current comparators 17 to 19 have two outputs, but there could also be employed current comparators having a single output.

They are advantageously current comparators having a current output.

Figure 2:
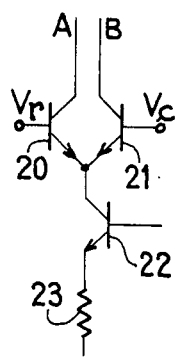
FIGS. 2–4 are circuit diagrams of comparators having two, four and six outputs which are part of the construction of the encoder shown in FIG. 1.
Figure 3:
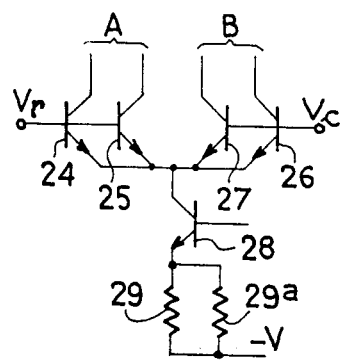
Figure 4:
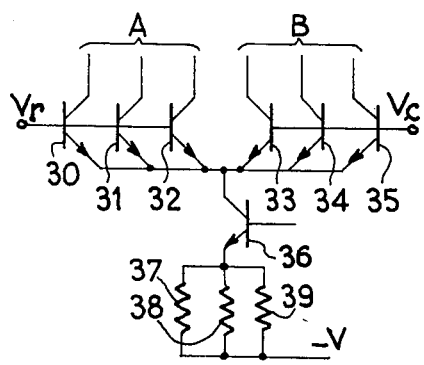

FIGS. 2 to 4 show preferred embodiments of comparators employed in the encoder according to the invention.

The comparator shown in FIG. 2 is a comparator having two outputs.

The comparators 9, 11, 13 and 15 are constructed in this way.

The comparator shown in FIG. 2 is constituted by a differential amplifier having two transistors 20 and 21 of the N-P-N type whose emitters are connected to the collector of a third transistor 22 also of the N-P-N type. The base of the transistor 20 forms the input of the reference voltage $V_r$ of the comparators and the base of the transistor 21 constitutes the input of the voltage to be encoded $V_c$. The collectors of the transistors 20 and 21 constitute respectively the outputs A and B of the comparator.

The base of the transistor 22 is connected to a terminal of a source of stabilized voltage and its emitter is connected to the other terminal of said source through a resistor 23.

The transistor 22 constitutes a source of current for the amplifier, this current passing through the output A or the output B according to the sign of the difference between the voltages $V_r$ and $V_c$.

The comparator shown in FIG. 3 is a comparator having two outputs A and two outputs B, such as the comparators 10 and 14 of the encoder shown in FIG. 1. Its construction is similar to that of the comparator shown in FIG. 2.

It comprises two transistors 24, 25 of the N-P-N type whose collectors constitute the outputs A of the comparator and two transistors 26, 27 of N-P-N type whose collectors constitute the outputs B.

The bases of the transistors 24, 25 form the input for the reference $V_r$ whereas the bases of the transistors 26, 27 constitute the input for the voltage to be encoded $V_c$.

The emitters of the transistors 24 to 26 are connected to the collectors of a transistor 28 whose emitter is connected to a terminal of a regulated voltage source through two resistors in parallel V and $29^a$ equal to the resistor 23 of the comparator shown in FIG. 1.

The transistor 29 can thus supply a current whose value is equal to twice that of the current supplied by the transistor 22 of the comparator shown in FIG. 2 so that there is available at each of the outputs A or B rendered conductive by the sign of the difference between $V_r$ and $V_c$ currents of equal value.

The comparator shown in FIG. 4 is similar to that shown in FIG. 3. It is employed as a comparator 12 having three outputs in the circuit shown in FIG. 1.

It comprises six transistors 30 to 35 and its source of current is constituted by a transistor 36 supplied through three resistors in parallel 37, 38, 39.

The comparators of the aforementioned type are easily produced in the integrated form so that the whole of the encoder according to the invention can be obtained in the modular form.

Figure 5:
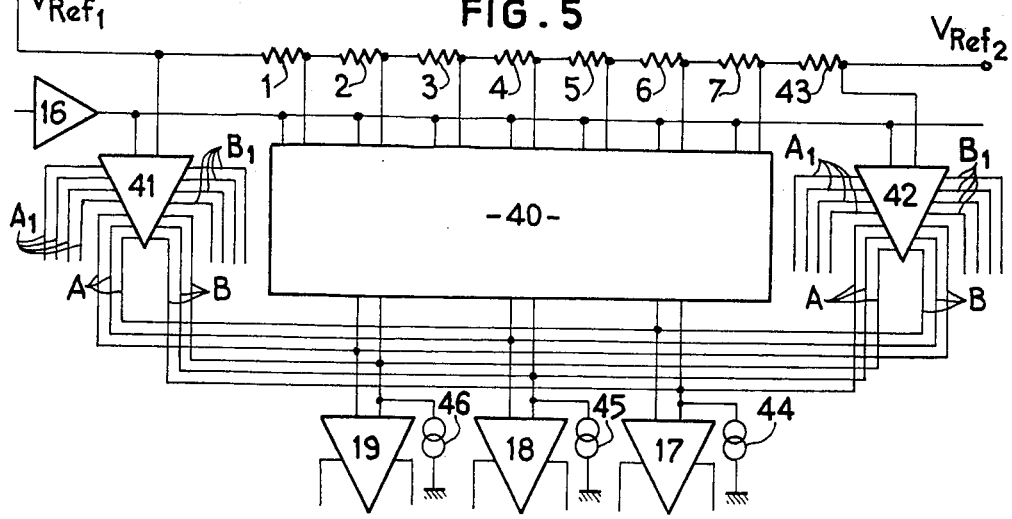
FIG. 5 represents the circuit diagram of an encoder according to the invention with which there are associated inhibiting comparators and comparators extending the number of bits.

The circuit shown in FIG. 5 is an analog-to-digital encoder which permits determining whether the voltage to be encoded is inside or outside the range of reference voltages determined by the scale of resistors of the encoder.

This circuit comprises, in the same way as the circuit shown in FIG. 1, a series of comparators represented by the rectangle 40.

The inputs of these comparators are connected, on one hand, to a scale of resistors 1 to 7 and, on the other hand, through an impedance adapter stage 16, to the voltage to be encoded.

The outputs of the comparator, are grouped, in the same way as in the encoder shown in FIG. 1, into six outputs connected in pairs to the inputs of three current comparators 17, 18, 19.

However, the circuit shown in FIG. 5 comprises two additional comparators 41 and 42 whose first inputs are connected respectively to the voltage to be encoded. The second input of the comparator 41 is connected directly to a terminal of the source of reference voltage, before the resistor 1, whereas the second input of the comparator 42 is connected directly to the other terminal of said source and to the resistor 7 through an additional resistor 43.

The function of the comparators 41 and 42 is to validate the encoder when the signal to be encoded is within the range determined by the resistors 1 to 7 of the encoder and to inhibit the encoder in the opposite case.

The comparators 41 and 42 are furthermore adapted to permit the juxtaposition of a plurality of encoders, such s that shown in FIG. 1, so as to increase the number of bits.

The comparator 41 has three outputs A respectively connected to the three inputs C of the comparators 17, 18 and 19 which receive the odd parity signals from all the comparators 40 and three outputs B connected respectively to the three inputs D of the comparators 17 to 19 which receive the even parity signals.

The comparator 42 has three outputs A connected respectively to the inputs of the three comparators 17 to 19 which receive the even parity signals and three outputs B respectively connected to the inputs of the comparators 17 to 19 which receive the odd parity signals.

Assuming that the voltage to be encoded is within the range defined by the resistors 1 to 7 and 43 of the scale of resistors, the outputs A of the comparator 41 are at level 0 and the outputs B are at level 1. The three inputs of the comparators 17, 18 and 19, connected to the outputs B of the comparator 41, therefore each receive a 1 whereas their three inputs, connected to the outputs A, receive an 0.

On the other hand, the outputs A of the comparator 42 are at level 1 whereas its outputs B are at level 0.

Consequently, the three odd inputs of the comparators 17, 18 and 19 receive a signal 0 whereas their three even inputs receive a signal corresponding to 2. The latter signal is compensated for by the current supplied by the auxiliary sources of current 44 to 46 connected to the even inputs of the comparators.

On the other hand, if the voltage to be encoded is outside the range defined by the resistors 1 to 7 and 43, for example if it is higher than the reference voltage applied to the comparator 42, the outputs A of the comparators 41 and 42 are equal to 1 and their outputs B are equal to zero. Consequently, the comparators 17 and 19 receive a 1 at their even inputs.

The comparators 17 to 19 are then inhibited by the disequilibrium produced by the current sources 44 to 46.

If the voltage to be encoded is lower than the lower limit of the range of voltages defined by the scale of resistors of the encoder, the even inputs and the odd inputs of the comparators 17 to 19 again receive a 1 from the comparators 41 and 42 and are inhibited in the same manner as before.

The comparators 41 and 42 moreover comprise a series of outputs $A_1$ and $B_1$ adapted to extend the number of bits of the encoder.

The function of the outputs $A_1$ and $B_1$ will now be explained with reference to FIG. 6.

FIG. 6 shows an assembly of two analog-to-digital encoders of the type shown in FIG. 5 arranged as a four-bit encoder.

The resistor scales 47 and 48 of the two encoders are connected in series and together define sixteen reference voltages.

The voltage to be encoded is applied to the inputs of two groups of seven comparators 49 and 50, identical to the group 40 of the circuit shown in FIG. 5, through an impedance adaptor stage 51.

The six outputs of the group 49 are connected in pairs to the inputs of three current comparators 52 to 54 whose even inputs are furthermore connected to current sources 55 to 57. On each side of the groups 49 and 50, there are connected inhibition and extension comparators 58, 59, 60.

The comparators 58 and 59 are connected by their outputs A and B to the inputs of the comparators 52 to 54 in the manner described with reference to FIG. 5.

The comparator 59 and 60 are also connected by their outputs A and B to the inputs of the current comparators 61 to 63 associated with the group 50, to the even inputs of which comparators there are connected sources of current 64 to 66.

The outputs of the comparators 52 and 61, 53 and 62, 54 and 63 are connected two by two so as to form three outputs of the encoder.

In the embodiment shown in FIG. 6, a four-bit encoder is constructed.

For this purpose, the comparators 58, 59 and 60 are connected by their outputs $A_1$ and $B_1$, in the same way as the comparators of each group 49 and 50, to the even and odd inputs of a current comparator 69 whose output constitutes the fourth bit of the encoder.

The circuit shown in FIG. 6 operates in a manner similar to the circuit shown in FIGS. 1 and 5.

By multiplying the number of encoders, it is possible to multiply the number of bits of the assembly by providing, for each one of the comparators such as 58, 59 and 60, as many pairs of outputs $A_1$ and $B_1$ as required by its rank, in the same way as for the comparators 9 to 15 of the encoder shown in FIG. 1.

The circuit shown in FIG. 6 is an encoder whose end comparators 41 and 42 each comprise four pairs of outputs $A_1$, $B_1$, which permit an extension by four of the number of bits by juxtaposing, in the manner shown in FIG. 6, the suitable number of comparators.

The circuits, such as that shown in FIG. 5, are constructed in the form of modular integrated circuits.

Consequently, upon extension, some of the end comparators are not employed, merely the comparators essential to the operation of the assembly being connected up.

The current comparators, such as the comparators 17 to 19 of the circuits shown in FIGS. 1 and 5 or the comparators 52 to 54, 61 to 63 and 69, are comparators having an input in current and an output in current, for example of the type of circuit shown in FIG. 7.

This comparator comprises a first transistor 70, of the N-P-N type, the base of which constitutes a first input of the comparator and a second transistor 71, of the N-P-N type, whose base constitutes a second input of the comparator.

The emitters of the transistors are all connected to the collector of a third transistor 72 of the N-P-N type which constitutes a source of current in the same way as the transistor 22 of the comparator shown in FIG. 3.

The comparator shown in FIG. 7 further comprises a fourth N-P-N transistor 73 whose base is connected to the collector of the transistor 70 and whose emitter is connected to ground through two diodes 74 and a resistor 75 connected in series.

The junction of the resistors 75 and diodes 74 is connected to the base of a fifth N-P-N transistor 76 whose emitter is connected to ground and whose collector constitutes the output of the comparator.

The encoder just described permits encoding the value of a voltage into a pure binary code.

However, the invention is in no way limited to such encoding. It is for example possible to construct an encoder adapted to ensure a BCD coding. Such an encoder will be identical to the encoder described hereinbefore except as concerns the total number of levels of comparison.

For example, for an encoder having four bits, instead of fifteen comparators necessary for the pure binary encoder, the BCD encoder requires only nine comparators.

As concerns the interconnection of the outputs of the comparators, it is effected in accordance with the same relations as those defining the connection of the outputs of the comparators of a pure binary code encoder for the bit of the smallest weight and that of the greatest weight. In respect of bits of intermediate weights, it is necessary to add the equivalent of an auxiliary current source corresponding to a fictive level 12 which is never reached.

The analog-to-digital encoder just described has over known encoders the advantage of being much more rapid owing to the fact that all the comparators of which it is composed are in parallel and receive the signals intended therefor practically simultaneously.

The encoding time of the encoder according to the invention is of the order of 20 ns, this time being still further reduced by the construction of the encoder in the form of an integrated circuit.

Having now described my invention what I claim as new and desire to secure by Letters Patent is:

1. A high-speed analogue-to-digital encoder for converting an input analogue signal into a combination of N bits, the encoder comprising:
    a first group of comparators each having a test input and a reference input;
    a source of reference voltages feeding a resistive network having a plurality of series connected resistors, and connected in parallel to said reference inputs;

an input circuit for feeding an analogue voltage to be encoded in parallel to said test inputs;

at least a pair of current outputs from each said comparators of said first group for delivering a logic current signal resulting from the comparison achieved in the comparator and a logic current complementary signal for generating lower order bits;

additional pairs of current outputs from some comparators of said first group of comparators, for generating higher order bits;

a second group of comparators, each having a first and a second current inputs, and at least a current output;

said inputs of said comparators of said second group being connected to said outputs of said comparators of said first group in such a manner that each comparator of said second group delivers a bit of a predetermined order of the voltage to be encoded.

2. A high-speed analogue-to-digital encoder as claimed in claim 1, wherein said first group of comparators comprises a first group of comparators each having a first current output for delivering a logic current signal and a second current output for delivering logic current complementary signal, and including connection means for connecting said first and second output of a comparator of said first group, to said second and first output respectively of a following comparator of said first group, said connection means being present for all comparators of said first group, resulting in the formation of a first group of outputs and a second group of outputs; and wherein said second group of comparators comprise a second group of current comparators each having a first and a second input and said first and second inputs of one of said comparators of said second group being connected to said first group of outputs and second group of outputs respectively for delivering at its output, the lowest-order bit of said input voltage to be encoded.

3. A high-speed analogue-to-digital encoder as claimed in claim 2, including, in the first group of said comparators, even rank comparators having a second pair of outputs, a first output of said pair delivering a logic current signal and a second output thereof delivering a logic current complementary signal, and including connection means for connecting said first and second output of a comparator of said even rank comparators to said second and first output respectively of a following comparator belonging to said even rank comparators, said connection means being present for all comparators of said even rank comparators, resulting in the formation of a second first group of outputs and a second second group of outputs; and in said second group of comparators, a second comparator having a first and second input and an output, said first and second input being connected to said second first group of outputs and said second second group of outputs respectively and said output of said second comparator delivering the bit of the order just above the lowest order bit, of the voltage to be encoded.

4. A high-speed analogue-to-digital encoder as claimed in claim 3, including, in the first group of said comparators, a subgroup comprising the third, sixth, ninth, twelfth and so on comparators having a third pair of outputs, a first output of said pair delivering a logic current signal and a second output of said pair delivering a logic current complementary signal; and connection means for connecting said first and second output of a comparator of said subgroup to said second and first output respectively of a following comparator of the subgroup, said connection means being present for all comparators of said subgroup resulting in formation of a third first group of outputs and a third second group of outputs; and wherein a third comparator of said second group of comparators has a first and a second input and an output, said first and second input being connected to said third first group of outputs and said third second group of outputs respectively and said output of this comparator delivering the bit of the order just above the preceding lower bit, of the voltage to be encoded.

5. A high-speed analogue-to-digital encoder as claimed in claim 4, wherein the comparators of said second group of comparators which deliver each a bit of a predetermined order of the voltage to be encoded are connected with their first and second input, to first and second outputs of subgroups of comparators belonging to said first group of comparators, each comparator of a subgroup having an additional pair of outputs and the comparators of each subgroup having their first and second outputs connected as in the other subgroups, and a central comparator having an additional pair of outputs connected to a comparator of said second group of comparators for delivering the highest-order bit of the voltage to be encoded.

6. A high-speed analogue-to-digital encoder as claimed in claim 1, wherein said first group of comparators comprises a first group of comparators, each having at least a first and a second input for delivering respectively a logic current signal and a logic current complementary signal, said comparators being parted into subgroups and each comparator of a subgroup having additional pairs of outputs, and said outputs being connected so that a first output of a comparator is connected to a second output of a following comparator and reciprocally, and each subgroup having a first group and a second group of outputs, and said second group of second group of comparators comprises a second group of comparators each having a first and a second current input and at least a current output, and said first and second group of inputs being connected to said first and second output of a comparator, resulting in each comparator delivering a bit of the voltage to be encoded from the lowest order to the highest; and additionally including inhibiting comparators each having a reference input and a test input, a first of said inhibiting comparators being connected to the input of the resistive network and a second of said inhibiting comparators being connected to an output of said resistive network, each said inhibiting comparator comprising a number of pairs of outputs equal to the resolution of said encoder, each pair of inhibiting outputs comprising a first output for delivering a logic current signal resulting from the comparison achieved in one of said comparators and a second output for delivering a logic current complementary signal, said first and second output of said first inhibiting comparator being connected to said second and first output respectively of said second inhibiting comparator, forming a first group and a second group of inhibiting outputs, said first and second group of inhibiting outputs being respectively connected to said first and second input of the comparators of said second group of comparators; and including current generators connected to the second inputs of each comparator of said second group, for compensating for the unbalance due to the connection of said inhibiting outputs to said comparators of the second group, when the voltage to be encoded is higher than the maximum reference voltage determined by the resistive network.

7. A high-speed analogue-to-digital encoder as claimed in claim 6, wherein each inhibiting comparator further includes a number of additional outputs equal to the number of bits of the encoder by which it is desired to increase the resolution of said encoder.

8. A high-speed analogue-to-digital encoder as claimed in claim 7, comprising further a first set of comparators and a second set of comparators, similar to said first group of comparators; a first resistive network for said first set and a second resistive network for said second set, said first and second resistive network being series connected; a first inhibiting comparator connected to the input of said first resistive network; a second inhibiting comparator connected to the function point of said first and second resistive network and a third inhibiting comparator connected to an output of said resistive networks, said inhibiting comparators having a plurality of pairs of outputs, the first output of a pair delivering a logic current signal and the second output delivering a logic current complementary signal, and said first and second output being connected to said second and first output respectively of a following inhibiting comparator; two sets of comparators similar to comparators of said second group, the output of each comparator of the sets delivering a bit of a same order being interconnected; said comparators being connected to the comparators of said sets of comparators and to said inhibiting comparators; compensating current generator means connected to the second input of a current comparator; and an additional current comparator connected to said second inhibiting comparator for delivering the highest-order bit of the voltage to be encoded.

9. A high-speed analogue-to-digital encoder as claimed in claim 1, wherein a comparator having voltage inputs and current outputs comprises at least one pair of transistors connected as a differential amplifier, the number of pairs of transistors of a given comparator being equal to the number of pairs of outputs of the comparator and a third transistor constituting a source of current, the emitters of the pair of transistors being connected to the collector of the third transistor, the bases of transistors of the pairs of transistors being connected in such manner as to constitute an input for the voltage to be encoded and an input for the reference voltage, and the collectors of each pair of transistors constituting the outputs delivering respectively the result of a comparison and its inverse.

10. A high-speed analogue-to-digital encoder as claimed in claim 1, wherein a comparator of the second group delivering a bit of the voltage to be encoded comprises a pair of transistors connected as a differential amplifier, a first source of current constituted by a third transistor, the pair of transistors being connected by their emitters to the first source of current, the bases of the transistors of said pair constituting the inputs of the comparator, a fourth transistor, a fifth transistor having a base connected to the emitter of the fourth transistor through at least one diode, the collector of one of the transistors of said pair being connected to the base of the fourth transistor, the collector of the fifth transistor constituting the output of the current comparator, the fourth and fifth transistors constituting with the diode a translation of voltage permitting the output in current to be at a level of standard voltage.

11. A high-speed analogue-to-digital encoder as claimed in claim 1, constructed in the form of an integrated circuit.

* * * * *